(12) United States Patent
Ogura et al.

(10) Patent No.: US 6,960,817 B2
(45) Date of Patent: Nov. 1, 2005

(54) SOLID-STATE IMAGING DEVICE

(75) Inventors: Masanori Ogura, Atsugi (JP); Hidekazu Takahashi, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/837,210

(22) Filed: Apr. 19, 2001

(65) Prior Publication Data

US 2002/0020845 A1 Feb. 21, 2002

(30) Foreign Application Priority Data

Apr. 21, 2000 (JP) ........................................ 2000-121132

(51) Int. Cl.$^7$ .......................................... H01L 31/0352
(52) U.S. Cl. ...................... 257/448; 257/223; 257/291; 257/292; 257/443; 257/459; 257/465
(58) Field of Search ................................ 257/223, 291, 257/292, 443, 445, 446, 457, 459, 465

(56) References Cited

U.S. PATENT DOCUMENTS

| | | | | |
|---|---|---|---|---|
| 4,148,048 A | * | 4/1979 | Takemoto et al. ............. 357/30 |
| 4,565,756 A | * | 1/1986 | Needs et al. .................... 430/7 |
| 4,652,899 A | * | 3/1987 | Hoeberechts ................. 357/29 |
| 4,791,493 A | | 12/1988 | Ogura et al. ................. 358/294 |
| 4,920,431 A | | 4/1990 | Ogura et al. ................. 358/496 |
| 4,926,058 A | | 5/1990 | Iwamoto et al. .......... 250/578.1 |
| 4,996,606 A | | 2/1991 | Kawai et al. ................. 358/475 |
| 5,196,691 A | | 3/1993 | Kitani et al. ............. 250/208.1 |
| 5,352,883 A | | 10/1994 | Kitani et al. ............. 250/208.1 |
| 5,506,430 A | * | 4/1996 | Ohzu ........................... 257/292 |
| 5,519,247 A | * | 5/1996 | Arbus et al. ................. 257/437 |
| 5,526,141 A | | 6/1996 | Ogura et al. ................. 358/496 |
| 5,587,611 A | * | 12/1996 | Botka et al. .................. 257/458 |
| 5,621,206 A | | 4/1997 | Kitani et al. .............. 250/208.1 |
| 5,698,844 A | | 12/1997 | Shinohara et al. ........... 250/214 |
| 5,751,032 A | * | 5/1998 | Yu ............................... 257/233 |
| 5,786,588 A | | 7/1998 | Takahashi ................. 250/208.1 |
| 5,796,153 A | * | 8/1998 | Marcovici .................... 257/446 |
| 5,900,622 A | | 5/1999 | Ogura et al. .............. 250/208.1 |
| 5,955,753 A | | 9/1999 | Takahashi .................... 257/292 |
| 6,015,200 A | | 1/2000 | Ogura ............................ 347/3 |
| 6,035,013 A | * | 3/2000 | Orava et al. ................... 378/37 |
| 6,147,338 A | | 11/2000 | Takahashi ................. 250/208.1 |
| 6,150,704 A | | 11/2000 | Kozuka ........................ 257/434 |
| 6,169,317 B1 | | 1/2001 | Sawada et al. ............. 257/435 |
| 6,188,094 B1 | | 2/2001 | Kochi et al. ................ 257/232 |
| 6,359,323 B1 | * | 3/2002 | Eom et al. .................... 257/440 |

FOREIGN PATENT DOCUMENTS

| | | | | |
|---|---|---|---|---|
| JP | 4-212459 | * | 8/1992 | ................. 257/436 |
| WO | WO 89/05042 | * | 6/1989 | ........... H01L/31/02 |

* cited by examiner

Primary Examiner—Bradley Baumeister
(74) Attorney, Agent, or Firm—Fitzpatrick, Cella, Harper & Scinto

(57) ABSTRACT

A novel solid-state imaging device is provided which has a first color picture cell array containing picture cells having a photo-electric converting element for converting incident light to electric signals arranged two-dimensionally, and a second color picture cell array containing picture cells having a photo-electric converting element for converting incident light to electric signals arranged two-dimensionally, placed in juxtaposition, on a substrate. The solid-state imaging device is characterized in that a common well is provided to be common to the first color picture cell array and the second color picture cell array. A well-wiring and a well-contact may be provided as necessary between the first color picture cell array and the second color picture cell array.

13 Claims, 9 Drawing Sheets

SOLID-STATE IMAGING DEVICE

BACKGROUND OF THE INVENTION

1. Field of the Invention

The present invention relates to a solid-state imaging device having plural photo-electric converting elements for converting incident light to electric signals.

2. Related Background Art

A solid-state imaging device for image formation is disclosed in Japanese Patent Application Laid-Open No. 62-11264. This solid-state imaging device has plural imaging lenses arranged on a plane, the respective imaging lenses focus the light from an image object on two-dimensionally arranged sensors having respectively a photo-electric converting element, and the output signals from the two-dimensional sensors are processed in an image-processing section to form an image.

FIG. 11 shows schematically constitution of a set of a conventional solid-state imaging device. In FIG. 11, solid-state imaging device 67 comprises imaging lenses 61, 62, 63 for focusing the light from the imaging object onto color picture cell arrays 64, 65, 66 having respectively a color filter of R, G, or B. With the color filters of R, G, and B, a color image is formed by compound-eye imaging.

In prior arts, planar layout of picture cells and circuit structures has been investigated. However, no investigation has been made about the sectional structure of the semiconductor chip constituting the solid-state imaging device like that shown in FIG. 11 and the process for preparation thereof, so far as the inventors of the present invention are aware of. No practical solid-state imaging device for compound-eye color imaging has been made.

According to the investigation by the inventors of the present invention, in the case where the picture cell arrays 2, 3, and 5 are placed apart for convenience in arrangement of the imaging lenses, the semiconductor chip has to be made larger naturally in size. Further, in this case, light comes to be introduced between the picture cell arrays 2, 3, and 5, which may cause flow of generated carriers (electric charge) into adjacent picture elements to cause cross talk of output signals. Further, it may cause shading of the obtained image signals.

SUMMARY OF THE INVENTION

An object of the present invention is to provide a practical solid-state imaging device which enables compound-eye imaging of a color image.

Another object of the present invention is to provide a solid-state imaging device with a smaller size of chip.

Still another object of the present invention is to provide a solid-state imaging device which will not cause cross talk.

A further object of the present invention is to provide a solid-state imaging device which will not cause shading.

The solid-state imaging device of an embodiment of the present invention has a first color picture cell array which contains picture cells having a photo-electric converting element for converting incident light to electric signals arranged two-dimensionally, and a second color picture cell array which contains picture cells having a photo-electric converting element for converting incident light to electric signals arranged two-dimensionally, placed in juxtaposition, on a substrate, wherein the substrate is provided with a common well being common to the first color picture cell array and the second color picture cell array. A well-wiring and a well-contact may be provided between the first color picture cell array and the second color picture cell array as necessary.

The solid-state imaging device of another embodiment of the present invention has a first color picture cell array which contains picture cells having a photo-electric converting element for converting incident light to electric signals arranged two-dimensionally, and a second color picture cell array which contains picture cells having a photo-electric converting element for converting incident light to electric signals arranged two-dimensionally, placed in juxtaposition on a substrate, wherein the solid-state imaging device has between the first color picture cell array and the second color picture cell array a well-contact and a well-wiring for applying a reference voltage to a common well common to the first color picture cell array and the second color picture cell array.

The solid-state imaging device of still another embodiment of the present invention has a first color picture cell array which contains picture cells having a photo-electric converting element for converting incident light to electric signals arranged two-dimensionally, a second and third picture cell arrays which respectively contain picture cells having a photo-electric converting element for converting incident light to electric signals arranged two-dimensionally, and a fourth color picture cell array which contains picture cells having a photo-electric converting element for converting incident light to electric signals arranged two-dimensionally, placed in juxtaposition on a substrate, wherein the first color picture cell array and the fourth color picture cell array are placed in a diagonal relation, and the second color picture cell array and the third color picture cell array are placed in another diagonal relation; and the solid-state imaging device has between the first color picture cell array and the second color picture cell array a well-contact and a well-wiring for applying a reference voltage to a common well common to at least the first color picture cell array and the second color picture cell array.

An element isolation region may be provided between the first color picture cell array and the second color picture cell array.

A light-intercepting member may be provided between the first color picture cell array and the second color picture cell array.

In the solid-state imaging device, preferably the photo-electric converting element is a photodiode; the picture cell has plural transistors of an insulating gate type; and the common well provides a first conductivity type semiconductor region for an anode or a cathode of the photodiode, and wells of the first conductivity type for the plural insulating gate type transistors.

In the solid-state imaging device, preferably the photo-electric converting element is a photodiode, and the common well provides a first conductivity type semiconductor region for an anode or a cathode of the photodiode, and a well for formation of a charge transfer channel of CCD.

In the solid-state imaging device, preferably a third color picture cell array is additionally provided which contains picture cells having a photo-electric converting element for converting incident light to electric signals arranged two-dimensionally.

In the solid-state imaging device, preferably the color picture cell arrays have respectively common color filters on the photo-electric converting elements.

In the solid-state imaging device, preferably the common color filter is a color filter of red, green, or blue.

The solid-state imaging device has preferably a terminal for connection with a power source for receiving a voltage for generating reference voltage for the common well.

In the solid-state imaging device, the well-wiring is preferably formed from a light-intercepting material to intercept the incident light not reach the common well region between the first color picture cell array and the second color picture cell array.

In the solid-state imaging device, the light-intercepting material is preferably a metal mainly composed of aluminum or copper.

In the solid-state imaging device, an anti-reflection film is formed on the well-wiring to prevent reflection of the incident light.

In the solid-state imaging device, the anti-reflection layer is preferably made of a material mainly composed of titanium nitride, tantalum nitride, tungsten nitride or tungsten.

The imaging device of an embodiment of the present invention for imaging an object comprises a solid-state imaging device mentioned above, and a power source for supplying a voltage for generating a reference voltage for the well-wiring of the solid-state imaging device from an outside of the solid-state imaging device.

The imaging device of another embodiment of the present invention for imaging an object comprises a solid-state imaging device mentioned above, and a focusing lens for focusing an image of an object on the color picture cell arrays.

DETAILED DESCRIPTION OF THE PREFERRED EMBODIMENTS

Figure 1:
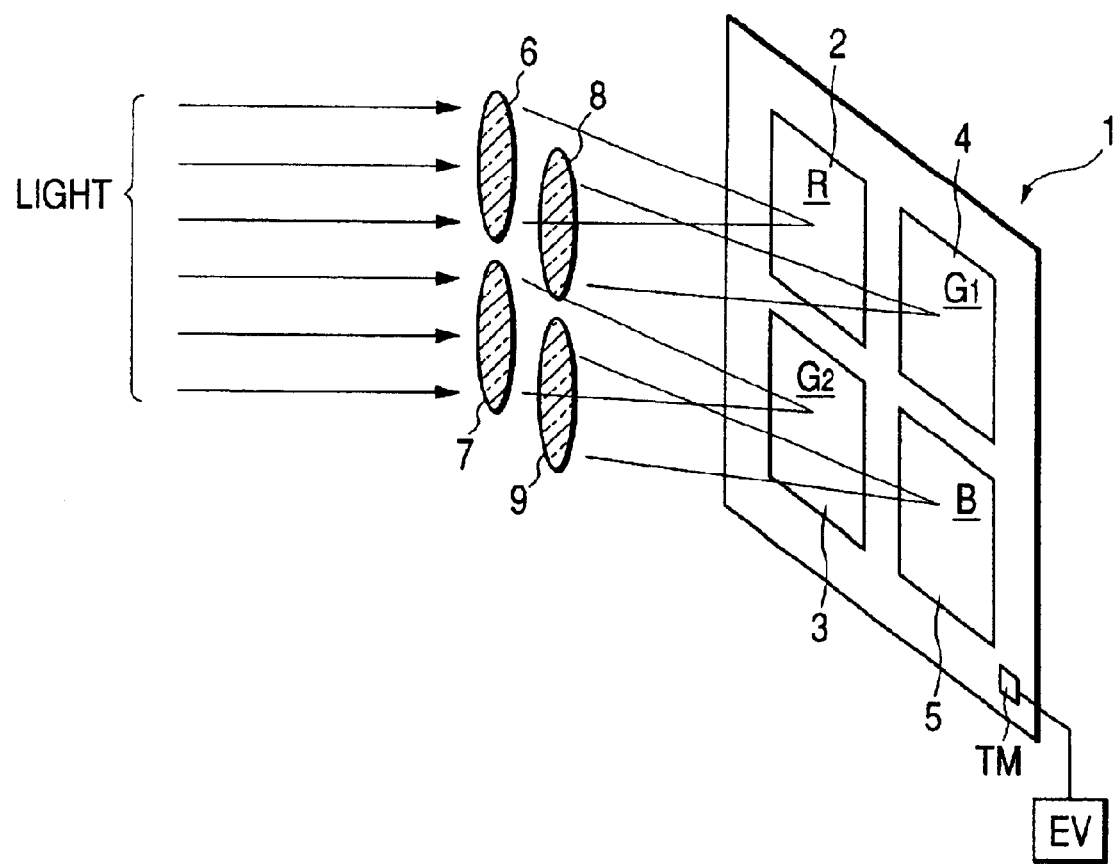
FIG. 1 illustrates schematically constitution of an imaging device of the present invention.

The embodiments of the present invention is described below by reference to drawings. In the drawings, the same reference symbols are used for the corresponding parts.
(Embodiment 1)

FIG. 1 illustrates schematically the constitution of the imaging device of Embodiment 1 of the present invention.

Figure 2A:
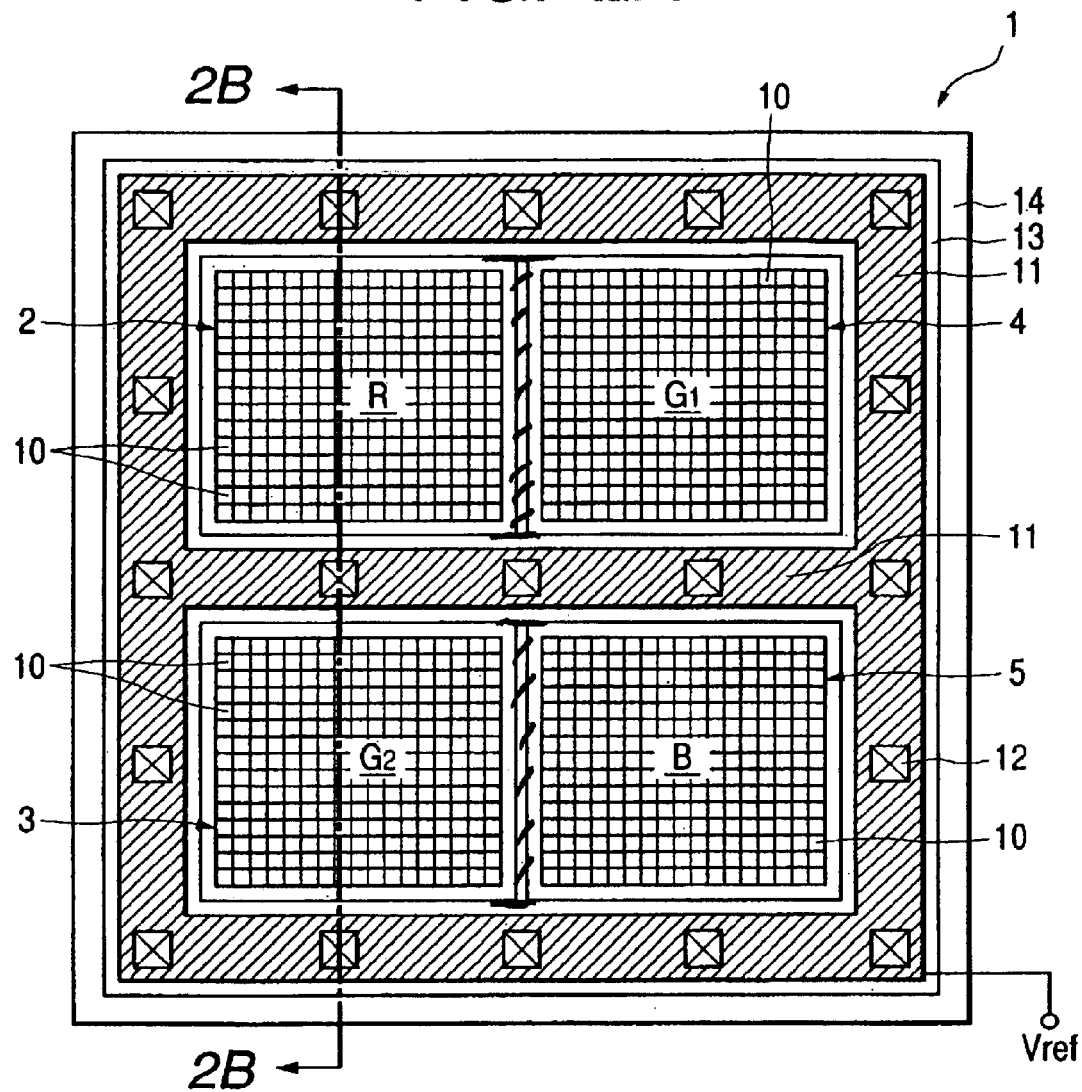
FIG. 2A and FIG. 2B are respectively a plan view and a sectional view of the solid-state imaging device of Embodiment 1 of the present invention.
Figure 2B:
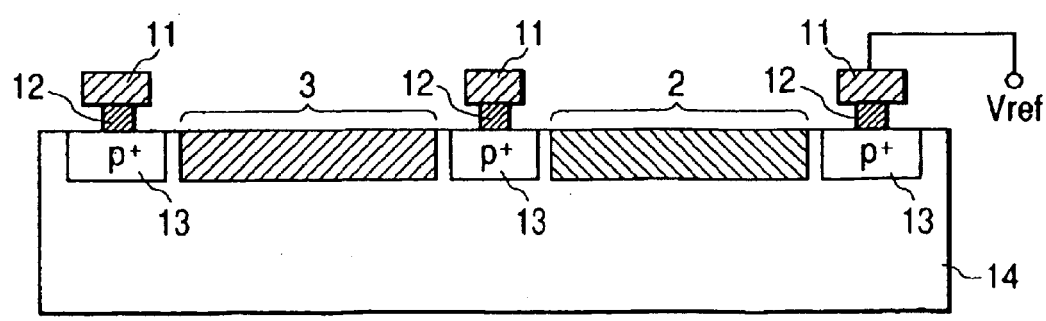

FIG. 2A is a plan view of the solid-state imaging device of a so-called four-eye type of Embodiment 1 of the present invention. FIG. 2B is a sectional view taken along line 2B—2B in FIG. 2A. In FIGS. 1, 2A, and 2B, the numeral 1 indicates a solid-state imaging device; 2 to 5, respectively a color picture cell array (imaging area); 6 to 9, respectively a focusing lens for focusing an image of an object on the color picture cell array; 10, a picture cell; 11, a well-wiring; 12, a well-contact; 13, a doped region; and 14, a common well region formed on a semiconductor substrate. Common well 14 is constituted of a semiconductor common to four picture cell arrays 2 to 5.

A first picture cell array 2 is comprised of two-dimensionally arranged photo-electric converting elements 10 for converting incident light into electric signals. A second picture cell array 3 is comprised of two-dimensionally arranged photo-electric converting elements 10 for converting incident light into electric signals. A third picture cell array 4 is comprised of two-dimensionally arranged photo-electric converting elements 10 for converting incident light into electric signals. A fourth picture cell array 5 is comprised of two-dimensionally arranged photo-electric converting elements 10 for converting incident light into electric signals. In this embodiment, the first color picture cell array 2 gives signals of red (R), the second color picture cell array 3 gives signals of green (G2), the third color picture cell array 4 gives signals of green (G1), and the fourth color picture cell array 5 gives signals of blue (B).

This solid-state imaging device is characterized by a well-contact 12 and a well-wiring 11 provided at least between first color picture cell array 2 and second color picture cell array 3 for application of a reference voltage Vref to a common well 14 common to first picture cell array 2 and second picture cell array 3.

In this device having four imaging areas, well-contact 12 and well-wiring 11 are also provided between third color picture cell array 4 and adjacent fourth color picture cell array 5 for application of a reference voltage Vref to a common well 14 common to third picture cell array 4 and fourth picture cell array 5.

Between the two adjacent color picture cell arrays 2 and 3, well-wiring 11 and well-contact 12 are provided, which are connected through doped region 13 by ohmic contact to common well 14.

During prescribed operation of the solid-state imaging device, a source voltage is applied from an external power source EV to terminal TM of the chip of the solid-state imaging device. This voltage or a voltage derived by transformation thereof within the chip is derived and is applied as the reference voltage to the well-wiring. The potential of common well 14 between the color picture cell arrays is held at a level corresponding to the reference voltage Vref (e.g., ground potential) by well-wiring 11 and well-contact 12, whereby the well potentials of all of the picture cells within common well 14 are kept nearly uniform to inhibit the shading.

Figure 3:
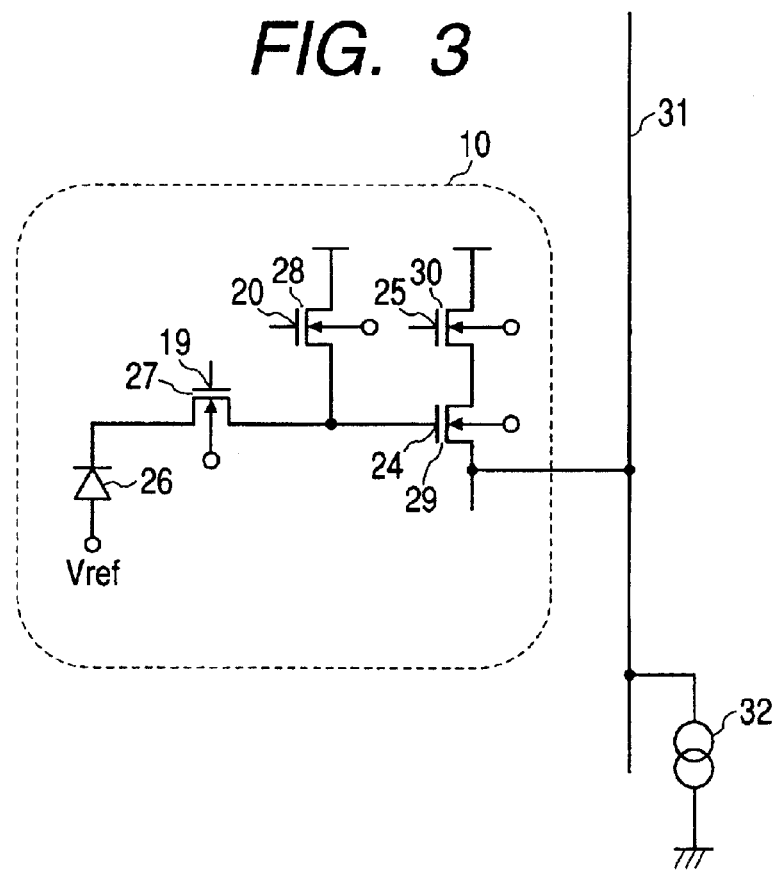
FIG. 3 shows a circuit structure of a picture cell employed in the present invention.

FIG. 3 shows a circuit structure of a picture cell employed in the present invention. The circuit comprises transfer gate 19 composed of polycrystalline silicon or the like, reset gate 20 composed of polycrystalline silicon or the like, selection gate 25 composed of polycrystalline silicon or the like for selecting the picture cell for signal readout, photodiode 26 serving as the photo-electric converting element, transfer switch 27 for transferring electric charges generated at photodiode 26, reset switch 28 for resetting an input gate 24 of amplifying transistor 29 to a reference resetting potential, line selection switch 30, vertical output line 31 for reading the signal from picture cells, and power source 32.

Figure 4:
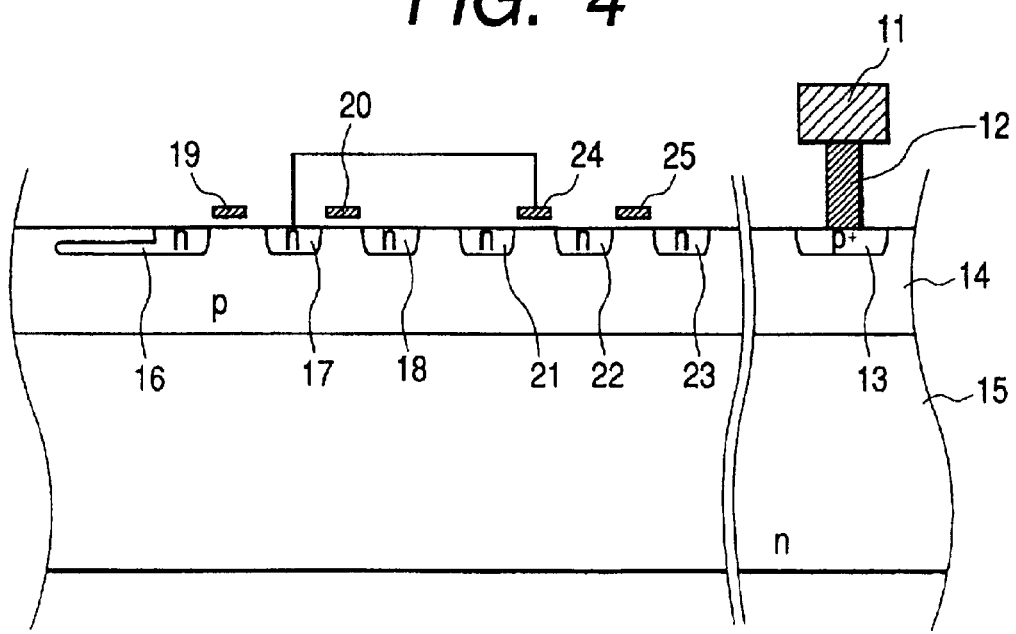
FIG. 4 is a sectional view showing constitution of a picture cell employed in the present invention.

FIG. 4 shows a sectional view of an element of a photodiode or a MOS transistor constituting a picture cell. Semiconductor region 16 serves as a cathode of a photodiode, and is capable of accumulating carriers (herein, electrons) generated by incident light. On the surface of this semiconductor region 16, an opposite conductive type of layer is provided to form a constitution of buried diode. Floating diffusion region 17 accumulates electric charge transferred by transfer switch 27. Semiconductor region 18 is connected to the reference voltage source for resetting. The regions 17 and 18 serve as a source/drain of a MOS transistor as a resetting switch. Regions 21, 22, and 23 serve as source/drains of the two MOS transistors constituting amplifying transistor 29 and selecting switch 30.

In this embodiment, cathode 16 of photodiode 26, floating diffusion region 17, and sources/drains 18, 21, 22, and 23 of the MOS transistor in the picture cells are semiconductor regions doped with an N-type impurity, and are formed respectively in a common well 14 composed of a P-type semiconductor on the surface side of substrate 15 composed of an N-type semiconductor.

Doped region 13 exists between the picture cell arrays and isolates them from each other.

The solid-state imaging device of this embodiment has four color picture cell arrays having respectively a color filter of R (red), G1 (green), B (blue), or G2 (green). Incident light is introduced into the picture cells 10 constituting picture cell arrays 2 to 5 through imaging lenses 6 to 9.

For convenience of optical design, for example, picture cell array 2 covered by an R filter and picture cell array 5 covered by a B filter are placed diagonally to each other, and picture cell array 4 covered by a G1 filter and picture cell array 3 covered by a G2 filter are placed diagonally to each other.

In this embodiment, a solid-state imaging device of a small size for compound-eye imaging is provided with four color picture cell arrays 2 to 5 formed in one common well. Thereby, the well potentials of the color picture cell arrays can be made uniform readily.

Further in this embodiment, there are provided well-wiring 11 and well-contact 12: well-wiring 11 being composed of aluminum, copper, or the like as the main constituent and formed between picture cell arrays 2 and 3 and between picture arrays 4 and 5 to intercept the incident light, and well-contact 12 being constituted of aluminum, tungsten, or the like as main constituent. The well contact 12 is formed by forming a contact hole in the insulating film covering common well 14 and depositing a conductive material into the contact hole. The well-wiring 11 is constituted of a conductive material deposited and patterned on the insulating film and the conductive material at the contact hole. Well-contacts 12 and well-wiring 11 may be deposited in separate steps or in one and the same step.

Well-wiring 11 is formed to surround the peripheral area of picture cell arrays 2 to 5 to prevent more the variation of the well potential in picture cells in each of picture cell arrays 2 to 5 and to reduce the shading. The well-wiring 11 intercepts the incident light directed to the interspace between picture cell arrays 2 and 3 and between picture cell arrays 4 and 5, thereby preventing the cross talk caused by electric charge generated there.

The solid-state imaging device of the present invention may have a picture cell structure of a MOS type of image sensor called CMOS sensor as shown in FIGS. 3 and 4, but may be of any other type of image sensor such as amplified MOS imagers (AMI), charge modulation devices (CMD), and CCD image sensors.

The MOS type image sensor, other than the one having the circuit structure shown in FIG. 3, may have a structure in which the transfer switch 27 is omitted to connect the photodiode directly to gate 24, or a structure which is constituted of a photodiode and a MOS switch as disclosed in the aforementioned Japanese Patent Application Laid-Open No. 62-11264.

The color picture cell arrays 2 to 5 in the present invention is not limited to those for color signals of R, G, and B, but may be for a color signals of yellow (Y), cyan (C), or magenta (M). For the color separation, color filters are provided on the light receiving areas of the respective picture cell arrays. Preferably one common color filter is formed on-chip to cover all the color picture cells in one picture cell array. The on-chip color filter includes known color filters such as pigment-colored filters formed by a pigment dispersion process, and dyed filters formed by a dyeing process.

The driving circuit for reading out signals from the respective picture cells 10, for example a vertical scanning circuit and a horizontal scanning circuit in a MOS type image sensor, may be provided inside or outside the well-wiring 11 surrounding the periphery of the entire regions of the four color picture cell arrays. In case where the driving circuit is provided outside, the drive-controlling line and the vertical output line are laid out in a multiple-layered wiring structure so as not to interfere with well-wiring 11 and well contact 12. In case of an interline CCD image sensor, the vertical CCD should be placed within the imaging area surrounded by the well-wiring, but the horizontal CCD may be placed inside or outside the imaging area surrounded by the well-wiring.

The material of well-wiring 11 can be selected from conductive materials containing aluminum, or copper as the main component, e.g. including pure aluminum, aluminum-silicon, aluminum-copper, aluminum-silicon-copper, and copper. Additionally, on at least one of the back face, the front face, and the side face, a layer may be provided which is comprised of a high-melting metal (fire-resistant metal) or nitrides thereof such as titanium, titanium nitride, tantalum, tantalum nitride, tungsten, and tungsten nitride. Preferably, such a layer is utilized as an anti-reflection layer as mentioned later.

The material of well-contact 12 may be selected from conductive materials containing aluminum, copper, or tungsten as the main component, including pure aluminum, aluminum-silicon, aluminum-copper, aluminum-silicon-copper, copper, and tungsten. Additionally, on at least one of the back face, the front face, and the side face, a layer may be provided which is comprised of a high-melting metal (fire-resistant metal) or nitrides thereof such as titanium, titanium nitride, tantalum, tantalum nitride, tungsten, and tungsten nitride.

Doped region 13 under well-contact 12 is formed from the semiconductor material of the same conduction type as common well 14 and of high impurity concentration. Preferably, on the surface thereof, a high-melting metal such as nickel, cobalt, platinum, and titanium is deposited and heat treated, and the doped region surface is silicidized to make the surface low-resistant and light-interceptive. The silicidized portion becomes a low-resistant light-interceptive layer. This layer itself can be used as a layer serving simultaneously as the well-contact and well-wiring.

(Embodiment 2)

Figure 5:
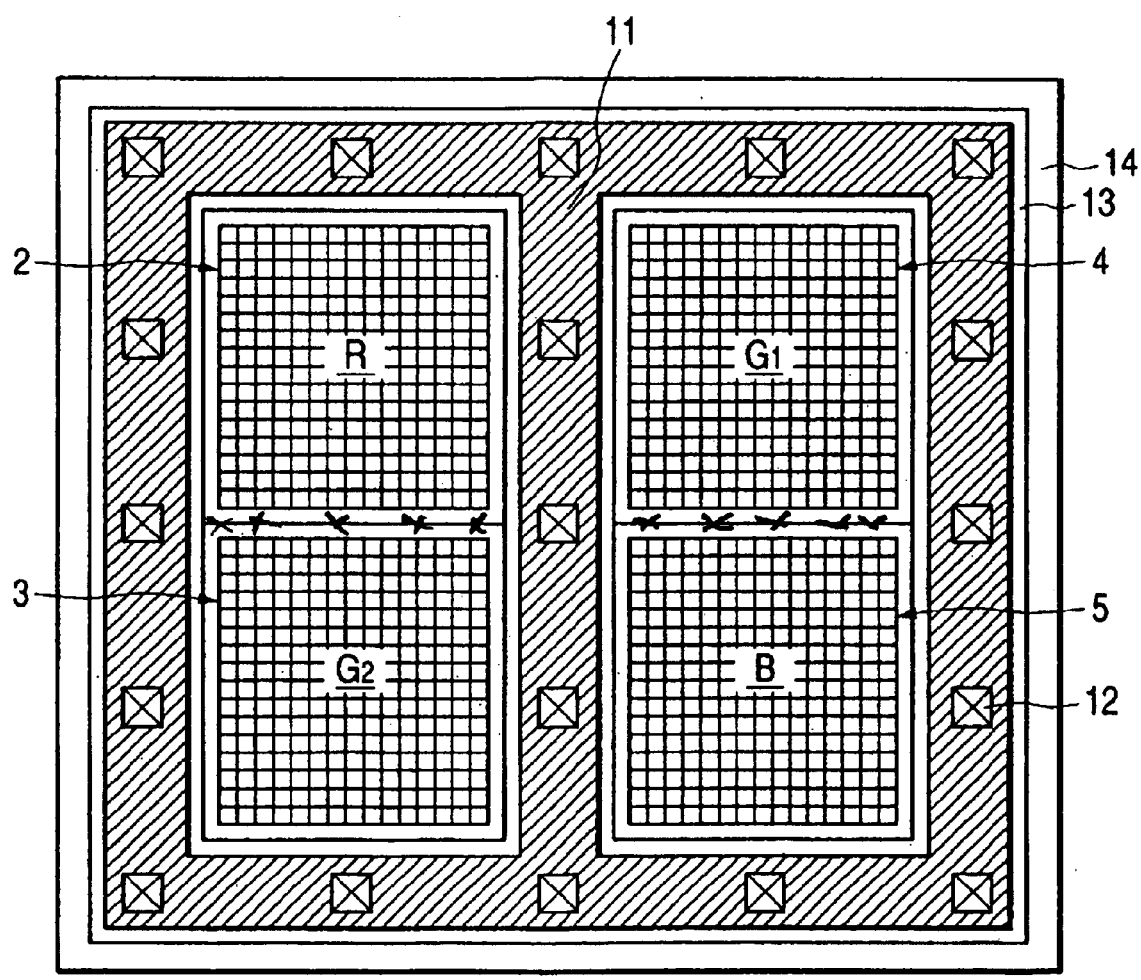
FIG. 5 is a plan view of the solid-state imaging device of Embodiment 2 of the present invention.

In this embodiment, the well-wiring and the well-contact between the adjacent picture cell arrays are displaced from the position in Embodiment 1 with the other constitution kept unchanged. As shown in FIG. 5, well-wiring 11 and well-contacts 12 are provided between picture cell arrays 2 and 4, and between picture cell arrays 3 and 5.

(Embodiment 3)

Figure 6:
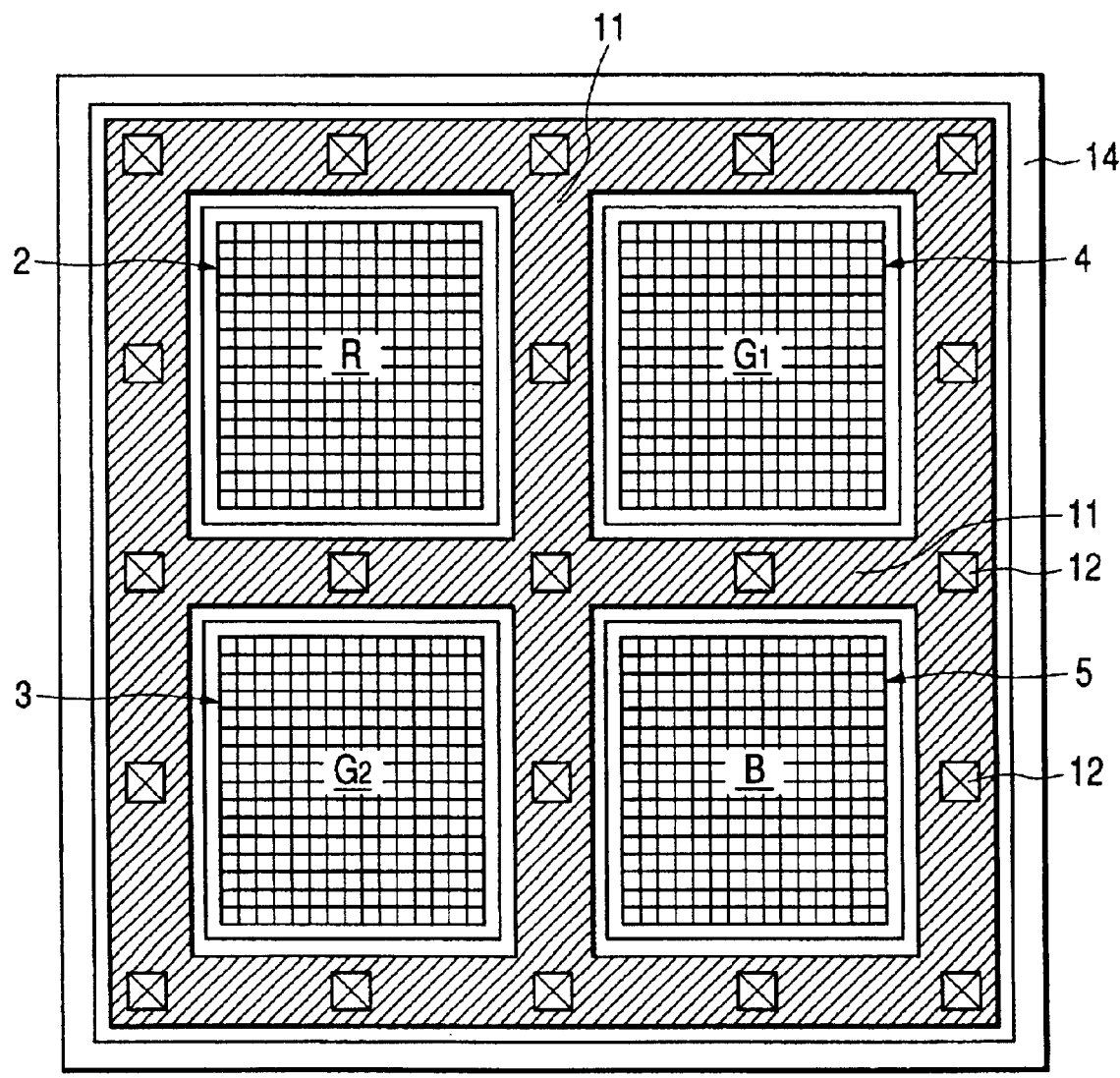
FIG. 6 is a plan view of the solid-state imaging device of Embodiment 3 of the present invention.

In this embodiment, the well-contacts and the well-wirings are provided on every interspace between the four adjacent picture cell arrays, corresponding a combination of Embodiments 1 and 2 above. As shown in FIG. 6, well-wiring 11 and well-contacts 12 are provided between picture cell arrays 2 and 3, between picture cell arrays 2 and 4, between picture cell arrays 3 and 5, and between picture cell arrays 4 and 5.

In this embodiment, the variation of the well potential in picture cell arrays 2 to 5 is decreased in comparison with Embodiments 1 and 2 and the shading is decreased. Furthermore, the light directed onto the interspace between the picture cell arrays is intercepted more completely to decrease further the cross talk.

(Embodiment 4)

This embodiment is partial modification of Embodiment 3: an anti-reflection layer is provided on the well-wiring. Otherwise the constitution is the same as in Embodiment 3.

Figure 7A:
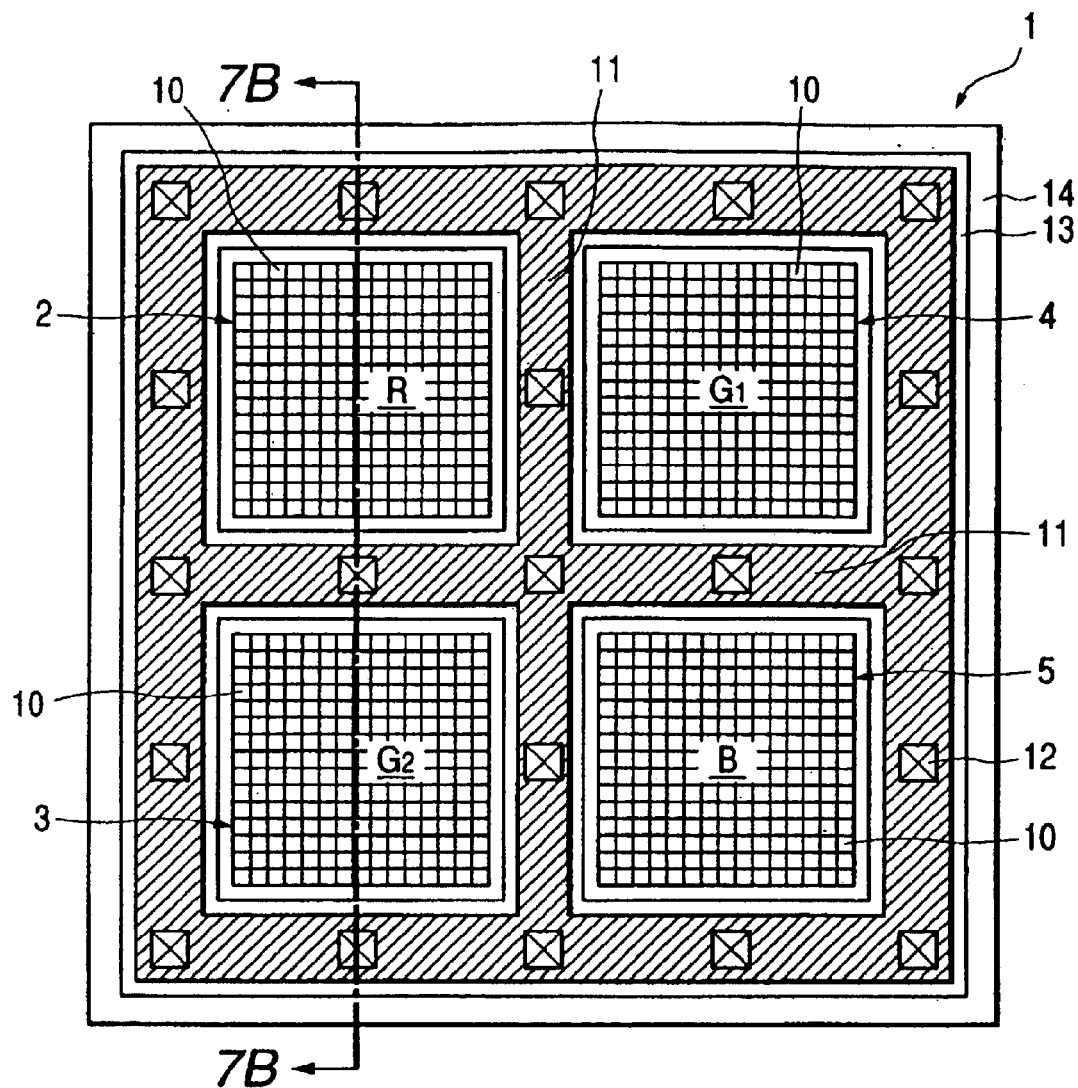
FIG. 7A and FIG. 7B are respectively a plan view and a sectional view of the solid-state imaging device of Embodiment 4 of the present invention.
Figure 7B:
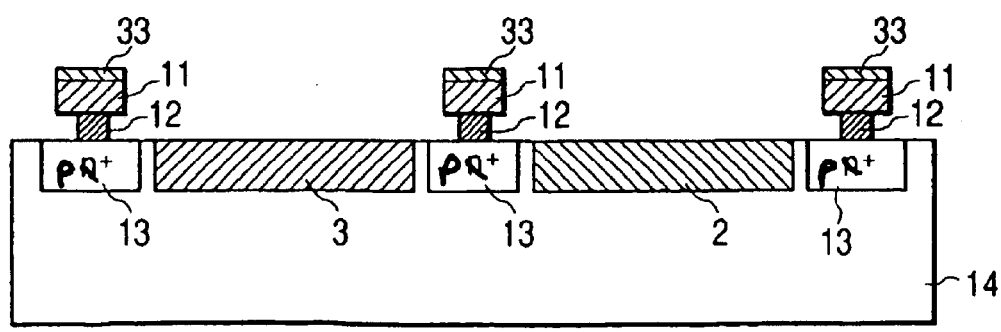

FIG. 7A is a plan view of a solid-state imaging device of this embodiment. FIG. 7B is a sectional view taken along line 7B—7B in FIG. 7A. In FIG. 7B, the numeral 33 denotes an anti-reflection layer of low reflectivity made of titanium nitride, tantalum nitride, tungsten nitride, tungsten, or the like. With the multiple layer structure having an anti-reflection layer 33 on well-wiring 11, the incident light is intercepted by well-wiring 11, and reflection by well-wiring 11 is prevented. Thereby, introduction of re-reflected light of the reflected light from well-wiring into picture cell arrays 2 to 5 are prevented. With this constitution, ghost and smearing caused by the reflection by wiring can be decreased further. Furthermore, the anti-reflection layer is preferably provided on the side face and the bottom face of well-wiring 11, or the side face of well-contact 12.

Incidentally, an anti-reflection layer 33 may be provided on the top of well-wiring 11 of pattern according to Embodiments 1 and 2.

(Embodiment 5)

Figure 8:
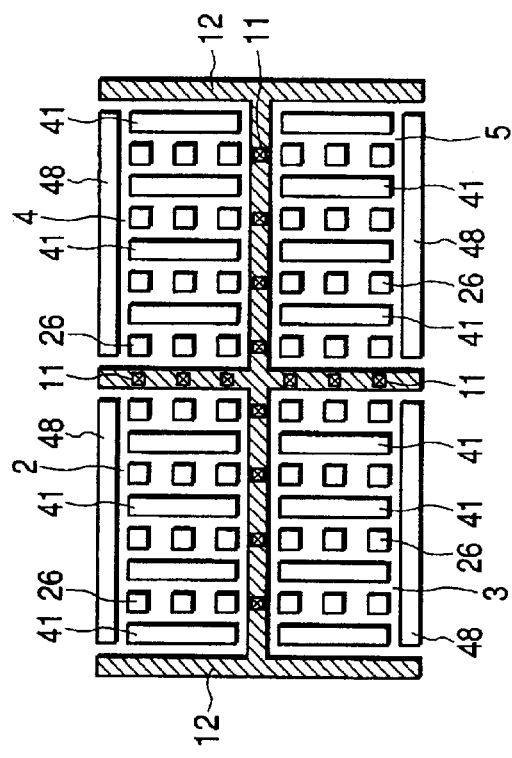
FIG. 8 is a plan view of the solid-state imaging device of Embodiment 5 of the present invention.
Figure 9:
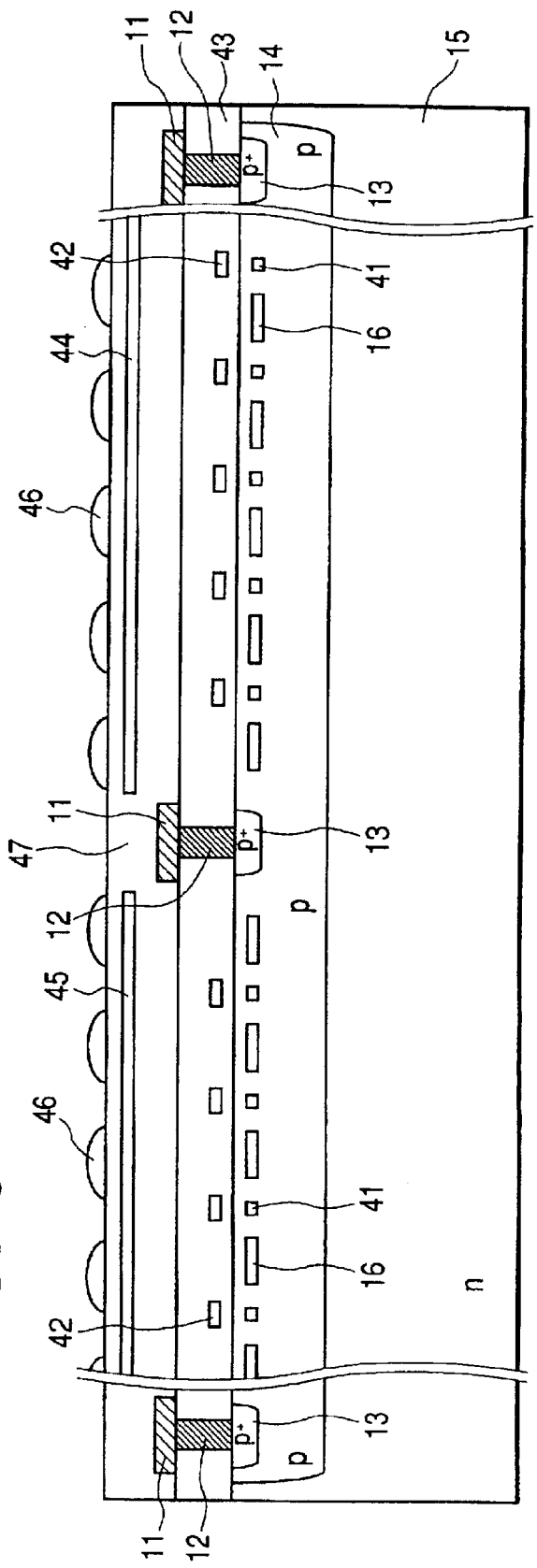
FIG. 9 is a sectional view of the solid-state imaging device of Embodiment 5 of the present invention.

The solid-state imaging device of this embodiment has a CCD image sensor to which the present invention is applied. FIG. 8 and FIG. 9 respectively show a plan view and a sectional view of the solid-state imaging device schematically.

In FIG. 8, the device has 2×2 imaging areas which have respectively a color filter similarly as in the above embodiments. Each of the imaging areas is constituted of a picture cell array of one color.

Each of the respective color picture cell arrays 2 to 5 has many picture cells containing photo-electric converting elements 26. In FIG. 8, one color picture cell array has 3×4 picture cells, but the number of the picture cells is not limited thereto. Vertical CCD 41 transfers the carriers transmitted from photo-electric converting element 26 like a photodiode in a vertical direction by 2 to 4 phase driving pulses applied to gate electrodes 42 of MIS structure. Horizontal CCD 48 transfers carriers from the vertical CCD in a horizontal direction. The output from the horizontal CCD is taken out from a charge-voltage converting element through a source follower of a MOS transistor not shown in the drawing.

Semiconductor region 16 of the photo-electric converting element capable of storing carriers, and the transfer channels of vertical CCD 41 and horizontal CCD 48 are formed in common well 14.

The numeral 43 denotes an insulating interlayer film. The well is connected to well-wiring 11 provided on insulating interlayer film 43, through well-contact 12 made from a conductor and filled in the contact hole provided through insulating interlayer film 43.

The well is connected with well-wiring 11 through well-contact 12 formed from a conductor filled in the contact hole provided through interlayer 43.

Well-wiring 11 and well-contacts 12 are formed also between the color picture cell arrays.

The numeral 47 denotes an insulating protection film or an insulating flattening film; 44 denotes a common color filter; 45 denotes another common color filter having a color different from that of color filter 44; and 46 denotes a microlens corresponding to one or more picture cells. Such a constitution of the color filters and the microlenses are applicable to the solid-state imaging devices of other embodiments.

By controlling the potential of the common well of a large area by the well-wiring and the well-contact, excess carriers can be discharged through well 14 to substrate 15. By controlling the potential of well 14 to change in correspondence with the operation mode, an electron shutter mode can be realized which lowers the potential of well 14 relative to the accumulated carriers to discharge the carriers accumulated in the semiconductor region to substrate 15.

(Embodiment 6)

Figure 10A:
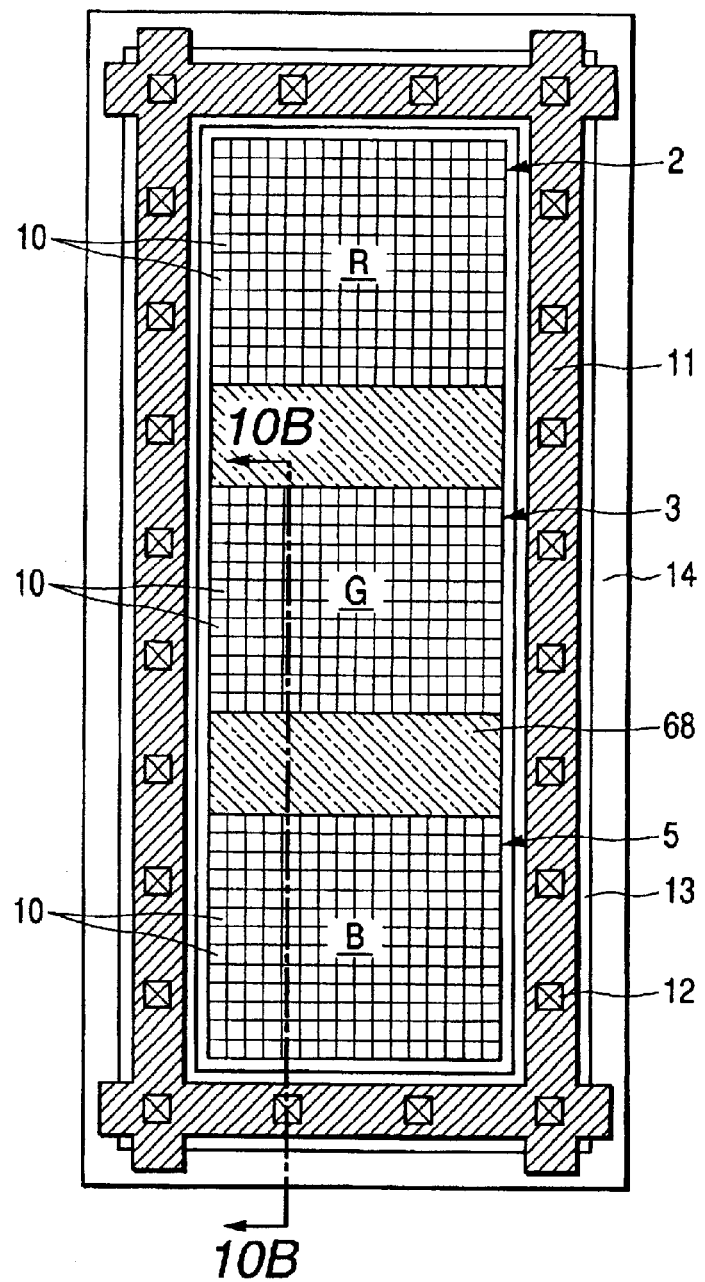
FIG. 10A and FIG. 10B are respectively a plan view and a sectional view of the solid-state imaging device of Embodiment 6 of the present invention.
Figure 10B:
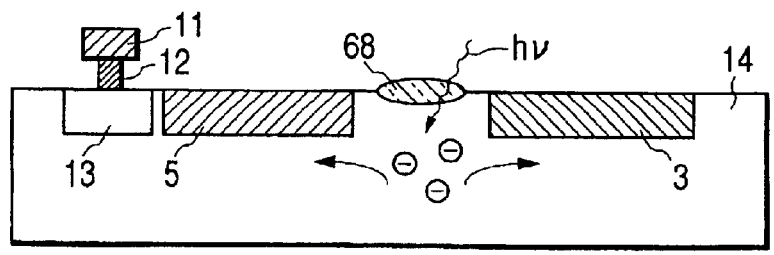
Figure 11:
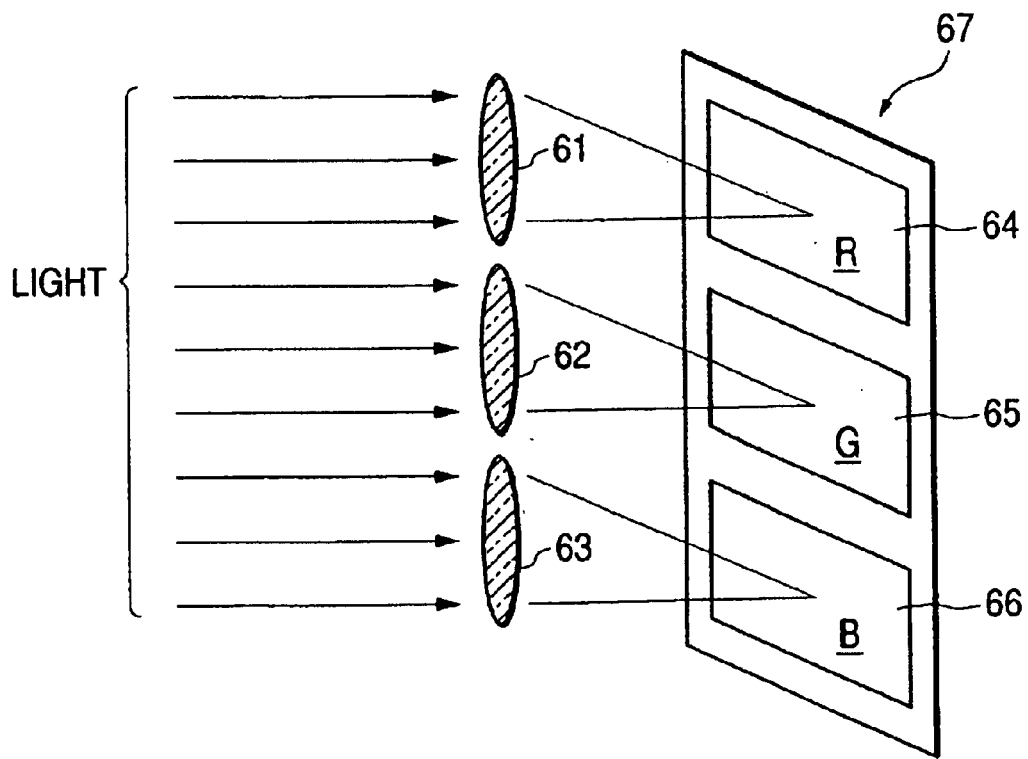
FIG. 11 illustrates schematically a conventional imaging device.

FIGS. 10A and 10B illustrate a solid-state imaging device of this embodiment.

In this embodiment, a single common well 14 is provided for all color picture cells constituting the color picture cell arrays, and in this common well 14, are provided cathodes or anodes constituting the picture cells, source/drains of the MOS transistor, CCD channels, and the like. In FIGS. 10A and 10B, the distance between the adjacent picture cell arrays is shown enlargedly. The actual distance ranges from several microns to several ten microns, or smaller. Thereby, color picture cell arrays 2, 3, and 5 are formed in this common well 14 with a smaller interspace between the arrays on one chip.

FIG. 10A is a plan view of a solid-state imaging device of a so-called three-eye type. FIG. 10B is a sectional view of the device taken along line 10B—10B. The device comprises picture cells 10 having a photo-electric converting element; well-wiring 11 for applying a potential to well 14, namely a p-type semiconductor diffusion layer (p-well) or an n-type semiconductor diffusion layer (n-well); a doped region 13 constituted of a semiconductor of the same conduction type as well 14 and containing impurity at a higher concentration; and well contact 12 for connecting well-wiring 11 with well 14.

In this embodiment, three color picture cell arrays 2, 3, and 5 give respectively red color signals, green color signals, and blue color signals; and the adjacent color picture cell arrays are isolated electrically by element isolation region 68 composed of a silicon oxide film or the like.

In the solid-state imaging device shown by FIGS. 10A and 10B, well-wiring 11 is provided to surround the periphery of color picture cell arrays of R, G, and B. Thereby, the distances of the picture cells in the R-, G-, and B-picture cell arrays distribute, which may cause variation of the potentials of the respective picture cells. The variation of the cell potential may cause variation of characteristics of the MOS transistor or the like in the picture cells to result in shading of picture cell signals. In particular, in recent years with the trend of increasing the picture cell number or the areas of the picture cell arrays, depression of the variation of the well potential is desirable.

The element isolation region 68 composed of a silicon oxide film cannot intercept the incident light, allowing the incident light to penetrate through the oxide film region between the picture cell arrays and to reach the underlying semiconductor region. The light introduced to the semiconductor region generates carriers there. The generated carriers may flow into the adjacent color picture cell arrays to cause cross talk.

To solve this problem, the well-wiring and the well-contact are provided between the color picture cell arrays as in Embodiments 1 to 5 to apply the reference voltage to the common well between the color picture cell arrays. Otherwise, the well-wiring is formed from a light-interceptive conductive film to intercept the light directing to the semiconductor region between the color picture cell array.

In the above embodiments, the conductivity type of the semiconductor may be reversed. For example, with an N-type of well, the reference voltage is made positive to reverse the bias of the PN junction.

The solid-state imaging device explained in the above embodiments of the present invention gives images of high quality in application to digital cameras or the like, owing to reduced cross talk.

As explained above, the present invention provides a solid-state imaging device having plural picture cell arrays containing photo-electric converting elements for converting incident light to electric signals and arranged two-dimensionally, wherein a common well is provided commonly for the color picture cell arrays. The photo-electric converting device is useful in color image formation of compound-eye type.

In the solid-state imaging device, well contacts are provided between some of the color picture cell arrays to prevent variation of the well potential to decrease shading.

In the device, on the region between the color picture cell arrays, introduced light is intercepted to decrease cross talk between the color picture cell arrays.

What is claimed is:

1. An imaging device having a first color picture cell array which contains picture cells having a photo-electric converting element for converting incident light to electric signals arranged two-dimensionally, and a second color picture cell array which contains picture cells having a photo-electric converting element for converting incident light to electric signals arranged two-dimensionally, placed in juxtaposition on a substrate, wherein the first and second color picture cell arrays are each provided with a respective color filter of a single color and a focusing lens, wherein said substrate is formed from a material having a first conductivity type and has a common well formed therein from a material having the opposite conductivity type to said substrate, said common well having doped regions therein of the same conductivity as said common well, wherein well contacts are provided on said doped regions of said common well which said doped regions are provided for at least at a side situated between the first and second color picture cell arrays with respect to each of the first and second color picture cell arrays, wherein a number of sides of each color picture cell arrays, at which sides the well contacts were set, are the same as one another, and wherein each of said well contacts are connected to each of said doped regions.

2. The imaging device according to claim 1, which has a terminal for connection with a power source for supplying a voltage for generating a reference voltage for the common well from an outside of the imaging device.

3. The imaging device according to claim 1, wherein the well-wiring is formed from a light-intercepting material to intercept the incident light upon the common well region between the first color picture cell array and the second color picture cell array.

4. The imaging device according to claim 1, wherein the photo-electric converting element is a photodiode, the picture cell has plural transistors of an insulating gate type, the common well provides a first conductivity type semiconductor region for an anode or a cathode of the photodiode, and each first conductivity type well for the plural insulating gate type transistors.

5. The imaging device according to claim 1, wherein the photo-electric converting element is a photodiode, and the common well provides a first conductivity type semiconductor region for an anode or a cathode of the photodiode, and a well for formation of a charge transfer channel of CCD.

6. The imaging device according to claim 1, wherein a third color picture cell array is additionally provided which array contains picture cells having a photo-electric converting element for converting incident light to electric signals arranged two-dimensionally.

7. An imaging device for imaging an object, comprising an imaging device set forth in claim 1, and a power source for supplying a voltage for generating a reference voltage for the well wiring of the imaging device from an outside of the imaging device.

8. The imaging device according to claim 1, wherein said doped regions are provided for on a plurality of sides of the first and second color picture cell arrays.

9. An imaging device having a first color picture cell array which contains picture cells having a photo-electric converting element for converting incident light to electric signals arranged two-dimensionally, second and third picture cell arrays which respectively contain picture cells having a photo-electric converting element for converting incident light to electric signals arranged two-dimensionally, and a fourth color picture cell array which contains picture cells having a photo-electric converting element for converting incident light to electric signals arranged two-dimensionally, placed in juxtaposition on a substrate, wherein the first color picture cell array and the fourth color picture cell array are placed in a diagonal relation, and the second color picture cell array and the third color picture cell array are placed in another diagonal relation;

wherein the first through fourth color picture cell arrays are each provided with a respective color filter of a single color and a focusing lens, wherein said substrate is formed from a material having a first conductivity type and has a common well formed therein from a material having the opposite conductivity type to said substrate, said common well having doped regions therein of the same conductivity as said common well, wherein well contacts are provided on said doped regions of said common well which said doped regions are provided for at least at a side situated between the first and second color picture cell arrays with respect to each of the first and second color picture cell arrays, wherein a number of the sides of each color picture cell arrays, at which sides the well contacts were set, are the same as one another, and wherein each of said well contacts are connected to each of said doped regions.

10. The imaging device according to claim 9, wherein the common well is common to all of the first to fourth picture cell arrays.

11. The imaging device according to claim 9, wherein the first color picture cell array has a color filter of one color of red and blue, the second and the third color picture cell arrays have green filters respectively, and the fourth color picture cell array has a color filter of the other color of red and blue.

12. An imaging device for imaging an object, comprising an imaging device set forth in claim 9, and a power source for supplying a voltage for generating a reference voltage for the well wiring of the imaging device from an outside of the imaging device.

13. The imaging device according to claim 9, wherein said doped regions are provided for on a plurality of sides of each of the first and second color picture cell arrays.

* * * * *

UNITED STATES PATENT AND TRADEMARK OFFICE
CERTIFICATE OF CORRECTION

| | |
|---|---|
| PATENT NO. | : 6,960,817 B2 |
| APPLICATION NO. | : 09/837210 |
| DATED | : November 1, 2005 |
| INVENTOR(S) | : Masanori Ogura et al. |

It is certified that error appears in the above-identified patent and that said Letters Patent is hereby corrected as shown below:

The attached Sheets 6 and 9 of the drawing should be substituted for the corresponding sheets of the printed patent.

COLUMN 3

Line 6, "not reach" should read --so that it does not reach--; and
Line 62, "is" should read --are--.

COLUMN 6

Line 9, "is" should read --are--; and
Line 10, "a" should be deleted.

COLUMN 7

Line 7, "corresponding" should read --corresponding to--.

COLUMN 8

Line 66, "depression" should read --reduction--.

COLUMN 9

Line 64, "arrays," should read --array,--.

COLUMN 10

Line 32, "of the" should read --of each of the--; and
Line 66, "arrays," should read --array,--.

Signed and Sealed this

Twenty-ninth Day of June, 2010

David J. Kappos
*Director of the United States Patent and Trademark Office*